United States Patent
Zhou et al.

(10) Patent No.: US 12,132,492 B2
(45) Date of Patent: Oct. 29, 2024

(54) METHOD AND SYSTEM FOR IMPROVING ANALOG-TO-DIGITAL CONVERSION PERFORMANCE

(71) Applicant: Hewlett Packard Enterprise Development LP, Spring, TX (US)

(72) Inventors: Dacheng Zhou, Fort Collins, CO (US); Peter Tsugio Kurahashi, Fort Collins, CO (US); Ryan Barnhill, Fort Collins, CO (US); Michael James Marshall, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 190 days.

(21) Appl. No.: 18/081,490

(22) Filed: Dec. 14, 2022

(65) Prior Publication Data
US 2024/0204789 A1 Jun. 20, 2024

(51) Int. Cl.
| | |
|---|---|
| *H03M 1/06* | (2006.01) |
| *H03M 1/12* | (2006.01) |
| *H03M 1/16* | (2006.01) |
| *H03M 1/38* | (2006.01) |

(52) U.S. Cl.
CPC ........ *H03M 1/0607* (2013.01); *H03M 1/1215* (2013.01); *H03M 1/1245* (2013.01); *H03M 1/167* (2013.01); *H03M 1/38* (2013.01)

(58) Field of Classification Search
CPC .. H03M 1/0607; H03M 1/167; H03M 1/1245; H03M 1/1215; H03M 1/38
See application file for complete search history.

(56) References Cited

U.S. PATENT DOCUMENTS 11,876,649 B2 * 1/2024 Wang ............... H04L 25/03019

OTHER PUBLICATIONS

Hu, W. et al., "An 8-Bit Singe-Ended Ultra-Low-Power SAR ADC With a Novel DAC Switching Method and a Counter-Based Digital Control Circuitry," Jul. 2013, IEEE Transactions on Circuits and Systems, vol. 60, No. 7, 1pp. 15.
Li, J. et al., "A 3GSps 12-bit Four-Channel Time-Interleaved Pipelined ADC in 40 nm CMOS Process," Dec. 16, 2019, Electronics 2019, 8, 1551, pp. 16.

(Continued)

*Primary Examiner* — Joseph J Lauture
(74) *Attorney, Agent, or Firm* — Yao Legal Services, Inc.

(57) ABSTRACT

A frontend circuit of a time-interleaved ADC is provided. The frontend circuit can include a track-and-hold circuit to sample an analog input signal to the ADC, a sub-ADC circuit to convert the sampled analog input signal to a digital output signal, and a source-follower circuit. An input of the source-follower circuit can be coupled to an output of the track-and-hold circuit, and an output of the source-follower circuit can be coupled to an input of the sub-ADC circuit. The source-follower circuit is to provide buffering between the track-and-hold circuit and the sub-ADC circuit. The circuit further includes a common-mode-adjusting circuit to dynamically adjust common-mode settings of the time-interleaved ADC. While adjusting the common-mode settings, the common-mode-adjusting circuit can adjust, separately, an input common-mode voltage of the track-and-hold circuit and an input common-mode voltage of the sub-ADC circuit based on current Process, Voltage, and Temperature (PVT) conditions.

20 Claims, 6 Drawing Sheets

(56) References Cited

OTHER PUBLICATIONS

Luu, D. et al., "A 12b 61dB SNDR 300MS/s SAR ADC With Inverter-Based Preamplifier and Common-Mode-Regulation DAC in 14nm CMOS FinFET," Aug. 14, 2017, IEEE Symposium on VLSI Circuits Digest of Technical Papers, pp. 2.
Siddiqui, W. H., et al., "12 bit 3.072 GS/s 32-way time-interleaved pipelined ADC with digital background calibration for wideband fully digital receiver application in 65 nm complementary metal-oxide-semiconductor," Feb. 11, 2020, The Institution of Electrical Engineers, pp. 10.
Texas Instruments Incorporated, "How to Use the Smart Analog Combo in MSP430 MCUs," Revised Oct. 2019, Application Report, SLAA833A, pp. 20.
Xu, B., "Calibration Techniques for High Speed Time-Interleaved SAR ADC," Aug. 2017, University of Texas at Dallas Dissertation, pp. 88.

* cited by examiner

METHOD AND SYSTEM FOR IMPROVING ANALOG-TO-DIGITAL CONVERSION PERFORMANCE

BACKGROUND

Field

This disclosure is generally related to analog circuit design. More specifically, this disclosure is related to the design of a frontend circuit of a time-interleaved analog-to-digital converter (TI-ADC).

BRIEF DESCRIPTION OF THE FIGURES

In the figures, like reference numerals refer to the same figure elements.

DETAILED DESCRIPTION

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown but is to be accorded the widest scope consistent with the principles and features disclosed herein.

Interleaving is a technique where multiple data converters sample a common signal and the sampling period for each converter is phase-shifted to effectively increase the system sampling rate. The increased sampling rate has made time-interleaved analog-to-digital converters (TI-ADCs) preferred choices for high-speed receivers, such as receivers used in high-speed networks. More specifically, a receiver can receive a high-speed analog RF signal, amplify and filter the received signal, and send the amplified and filtered signal to the ADC for analog-to-digital conversion. TI-ADCs can achieve high sampling rate by using multiple identical ADCs (referred to as sub-ADCs) to process the signal at a faster rate than the operating sample rate of each individual ADC.

A typical TI-ADC can include a number of parallel channels that alternatively sample the input analog signal. Each channel can include a track-and-hold (T/H, also referred to as sample-and-hold or S/H) circuit that samples the input analog signal and a sub-ADC that converts the sample to a digital value. The performance of the T/H circuit and the sub-ADC is sensitive to their common-mode settings across PVT (Process, Voltage, and Temperature) variations. Optimizing the ADC performance requires setting the common-mode voltages of the T/H circuit and the sub-ADC to their optimal values.

Figure 1:
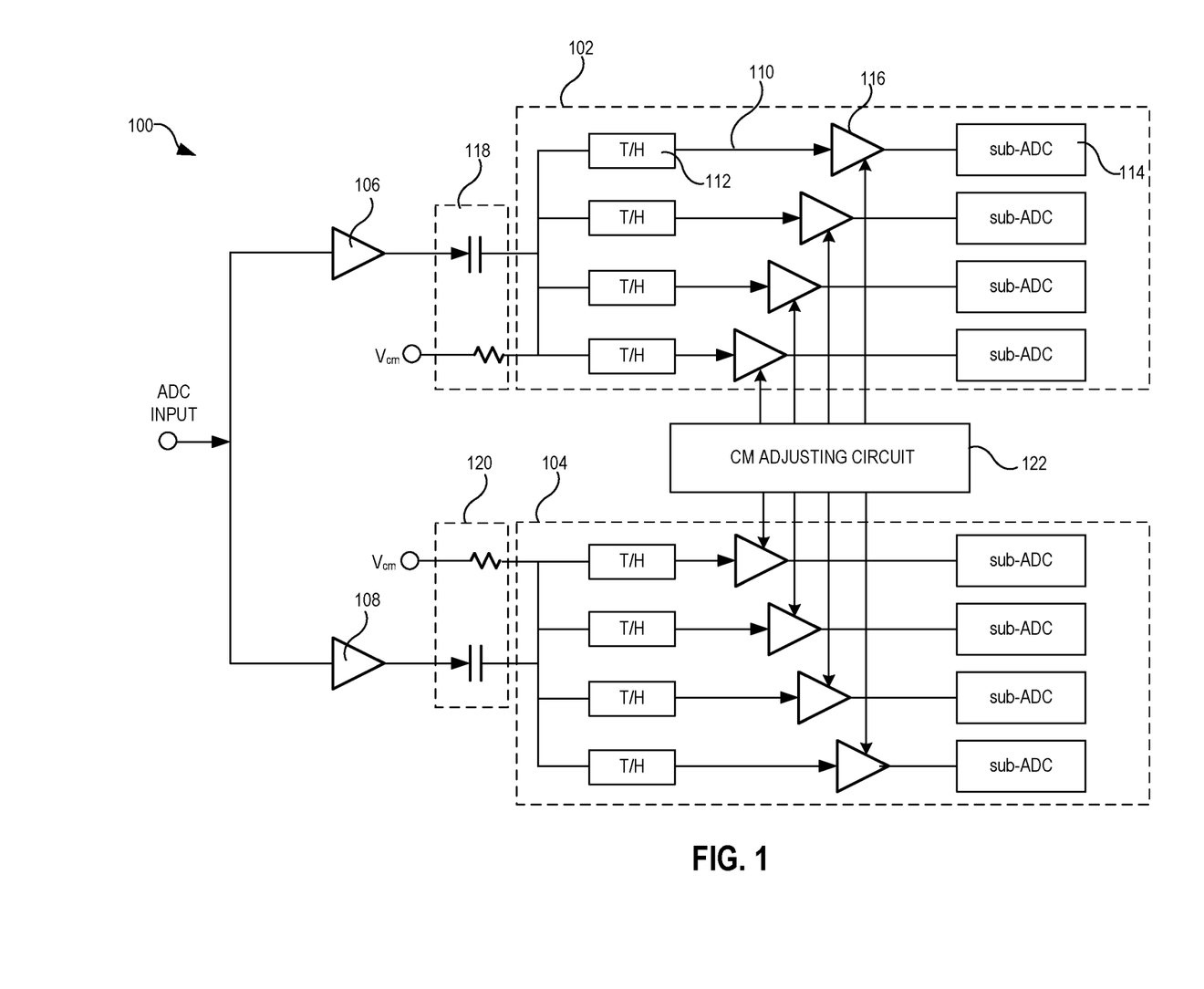
FIG. 1 illustrates an example of a frontend circuit of a time-interleaved analog-to-digital converter (TI-ADC), according to one aspect of the instant application.

FIG. 1 illustrates an example of a frontend circuit of a TI-ADC, according to one aspect of the instant application. A TI-ADC 100 can include multiple parallel channels grouped into two channel groups, an even-channel group 102 and an odd-channel group 104. Channels in even-channel group 102 (e.g., channel 0, 2, 4, 6, etc.) are sampling the input signal at even-numbered sampling periods, and channels in odd-channel group 104 (e.g., channel 1, 3, 5, 7, etc.) are sampling the input signal at odd-numbered sampling periods. The channels are grouped into two separate groups to prevent overlapping in time between adjacent sampling periods. Each channel group is coupled to the frontend circuit of the receiver (not shown in FIG. 1) via a buffer amplifier, which can provide buffering (e.g., voltage buffering) between the receiver frontend circuit and the ADC frontend circuit such that the ADC circuit does not add excessive load to the receiver frontend circuit. In the example shown in FIG. 1, even-channel group 102 is coupled to a buffer amplifier 106, and odd-channel group 104 is coupled to a buffer amplifier 108.

Each channel can include a T/H circuit, a sub-ADC circuit, and a buffer amplifier positioned between the T/H circuit and the sub-ADC circuit. For example, a channel 110 includes a T/H circuit 112, a sub-ADC 114, and a buffer amplifier 116. T/H circuit 112 can also be referred to as a T/H switch, which switches on and off to allow the incoming analog signal to pass through during predetermined sampling intervals. In one example, T/H circuit 112 can include one or more switches and a capacitor for holding the voltage. The switches can be implemented using transistors, such as field-effect transistors (FETs).

Sub-ADC circuit 114 can convert the samples to digital values using comparators, which compare the samples with reference voltages. In the drawing, sub-ADC circuit 114 is shown as one device. In practice, each sub-ADC circuit can include multiple sub-ADC units to facilitate cascaded time-interleaving, with each sub-ADC unit outputting a digital code representing a time sample of the input signal. In one example, the sub-ADC circuit in each channel can include eight sub-ADC units, increasing the overall time-interleave ratio by eight folds.

Buffer amplifier 116 is positioned between T/H circuit 112 and sub-ADC circuit 114 and can provide voltage buffering between T/H circuit 112 and sub-ADC circuit 114, such that sub-ADC circuit 114 does not generate an excessive load at T/H circuit 112. According to some aspects, buffer amplifier 116 can be a source follower.

The performance of T/H circuit 112 and sub-ADC circuit 114 can be sensitive to their corresponding common-mode settings (i.e., the direct current (DC) bias levels of their input signals). For example, the transistors in T/H circuit 112 are expected to have a fast switch time and are often implemented using p-channel field-effect transistors (FETs). To reduce the turn-on resistance of the p-channel FETs, T/H circuit 112 prefers a relatively higher common-mode voltage (e.g., a voltage greater than 0.6 V) compared with the common-mode voltage used for n-channel FETs. On the other hand, the comparators in sub-ADC circuit 114 typically require a relatively lower common-mode setting (e.g., a voltage at about 0.3 V). The performance of the entire ADC can be negatively affected if the common-mode settings of T/H circuit 112 and sub-ADC circuit 114 are not optimal. For example, the overall bit-error rate (BER) at the receiver may increase if the common-mode settings of the T/H circuits and sub-ADC circuits are not optimized.

Therefore, to improve the performance of the ADC, the common-mode settings of the T/H circuits (e.g., T/H circuit 112) and sub-ADC circuits (e.g., sub-ADC 114) need to be optimized. Note that the performance of the ADC can be directly correlated with the BER performance of the receiver. Improving the ADC performance can reduce the BER at the receiver such that the reviver can recover the transmitted information correctly. However, in conventional ADCs, the input common-mode voltage of the T/H circuit can be affected by the common-mode setting of the frontend circuit of the receiver, which can include filters, low-noise amplifiers (LNAs), frequency mixers, etc. In other words, the common mode of the signals sent from the frontend circuit of the receiver to the ADC would affect the common mode of the T/H circuits. Optimizing the common-mode voltages of the T/H circuits requires decoupling between the output common-mode voltage of the receiver frontend circuit and the input common-mode voltage of the ADC frontend circuit (i.e., the T/H circuits). According to some aspects, the receiver frontend circuit and the ADC frontend circuit can be alternating-current (AC) coupled to allow their common modes to be set independently. In the example shown in FIG. 1, a resistor-capacitor (RC) filter 118 can be positioned between buffer amplifier 106 and the T/H circuits belonging to even-channel group 102, and an RC filter 120 can be positioned between buffer amplifier 108 and the T/H circuits belonging to odd-channel group 104. More specifically, each RC filter can be a high-pass filter that prevents low-frequency (e.g., DC or near DC) signals from reaching the T/H circuits, thus allowing the common mode of the T/H circuits to be set independently of the output of the receiver frontend circuit. For example, the 3 dB cutoff frequency of each high-pass RC filter can be set at about 500 KHz or lower. Considering that the ADC in high-speed receivers is operating at a very high sample rate (e.g., 10 GS/s or beyond), 500 KHz can be considered sufficiently low to block the DC component of the signals without affecting the data-carrying signals.

In addition, the common modes of the T/H circuit and the sub-ADC circuit in each channel may also affect each other, and optimizing their common modes also requires the independent control of these two common modes. Note that, because the T/H circuit can be resistive when the switches (e.g., the p-channel transistors) are turned on, the input and output common-mode voltages of the T/H circuit are the same. Optimizing the input common-mode voltage of the T/H circuit can be equivalent to optimizing its output common-mode voltage. As can be seen from FIG. 1, in each channel, a buffer amplifier (e.g., source follower 116) is positioned between the T/H circuit (e.g., T/H circuit 112) and the sub-ADC circuit (e.g., sub-ADC circuit 114), with the input common-mode voltage of the source follower being the output common-mode voltage of the T/H circuit and the output common-mode voltage of the source follower being the input common-mode voltage of the sub-ADC circuit. This means that optimizing the common modes of the T/H circuit and the sub-ADC circuit separately is equivalent to optimizing the input and output common-mode voltages of the source follower separately. Because the optimal common modes of the T/H circuit and the sub-ADC circuit can vary with the PVT, the common-mode settings may need to be adjusted dynamically based on PVT variations. According to some aspects, TI-ADC 100 can include a common-mode (CM) adjusting circuit 122 that can dynamically and separately adjust the input and output common-mode voltages of the source follower in each channel in order to optimize the common-mode settings of both the T/H circuit and the sub-ADC circuit. For example, CM adjusting circuit 122 can adjust the input and output common-mode voltages of source follower 116 in order to optimize the common-mode settings of T/H circuit 112 and sub-ADC circuit 114, thus improving the data-conversion performance of TI-ADC 100. Note that adjusting the input and output common-mode voltages of source follower 116 means adjusting the DC levels of the input and output signals of source follower 116.

Figure 2:
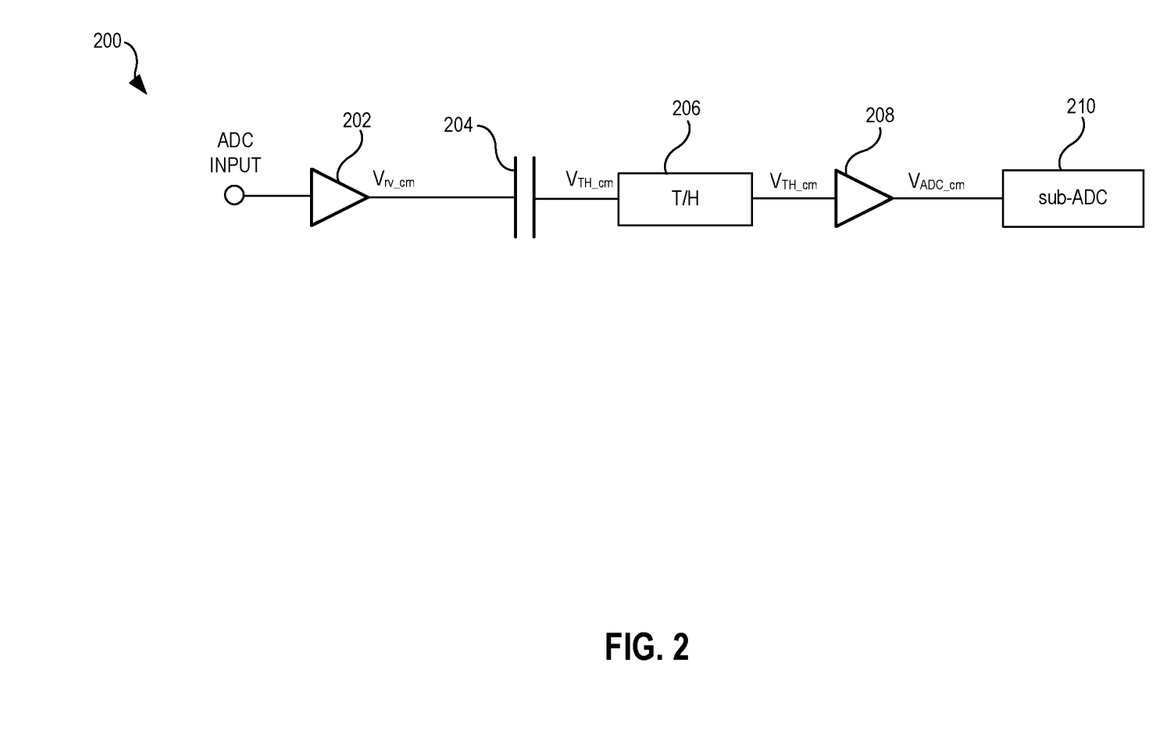
FIG. 2 illustrates various common-mode settings co-existing in an ADC, according to one aspect of the instant application.

FIG. 2 illustrates various common-mode settings co-existing in an ADC, according to one aspect. In this example, only one TI channel is shown, as the multiple parallel channels are similar to each other. In FIG. 2, a TI channel 200 can include a first buffer amplifier 202, a capacitor 204, a T/H circuit 206, a second buffer amplifier 208, and a sub-ADC 210. FIG. 2 also shows that the output common-mode voltage of first buffer amplifier 202 can be determined by the common-mode voltage of the receiver frontend circuit and is denoted $V_{rv\_cm}$. Depending on the design of the receiver frontend circuit, $V_{rv\_cm}$ may have different values. In one example, the receiver frontend circuit can include a continuous time linear equalization (CTLE) amplifier that compensates for the high-frequency loss of the incoming signal. The common mode of the CTLE and hence $V_{rv\_cm}$ can be approximately 0.5 V. As discussed previously, the input and output common-mode voltages of T/H circuit 206 are the same and denoted as $V_{TH\_cm}$. To reduce the turn-on resistance of the p-channel FETs in T/H circuit 206, $V_{TH\_cm}$ can be set to a higher value (e.g., between 0.5 and 0.7 V). The input common-mode voltage of sub-ADC 210 can be denoted $V_{ADC\_cm}$. Because the comparators in sub-ADC 210 favor lower voltages, $V_{ADC\_cm}$ can be set lower than $V_{TH\_cm}$, e.g., to a value between 0.25 V and 0.35 V.

As can be seen from FIG. 2, the AC coupling (via capacitor 204) between first buffer amplifier 202 and T/H circuit 206 allows $V_{TH\_cm}$ to be adjusted independently of $V_{rv\_cm}$. Moreover, $V_{TH\_cm}$ and $V_{ADC\_cm}$ may be the same as the input and output common-mode voltages, respectively, of second buffer amplifier 208, which can be a source follower. Hence, the problem of optimizing $V_{TH\_cm}$ and $V_{ADC\_cm}$ can become the problem of optimizing the input and output common-mode voltages of source follower 208.

Figure 3A:
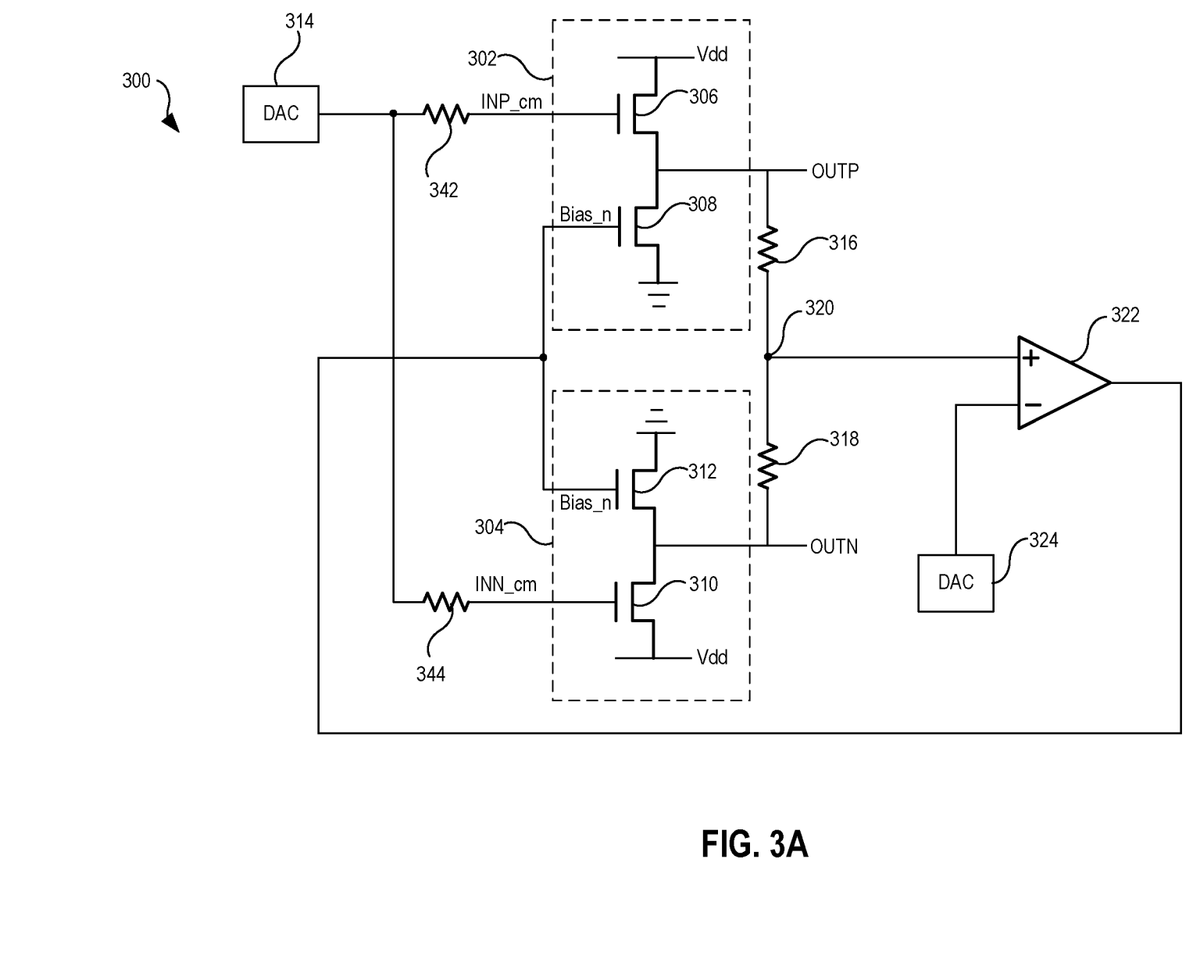
FIG. 3A illustrates an example of a source follower with a common-mode-adjusting circuit, according to one aspect of the instant application.

FIG. 3A illustrates an example of a source follower with a common-mode-adjusting circuit, according to one aspect. In FIG. 3A, a differential source-follower circuit 300 can include a positive signal path 302 coupled to the positive input (INP) of the incoming signal (which is the positive output of the T/H circuit) and a negative signal path 304 coupled to the negative input (INN) of the incoming signal (which is the negative output of the T/H circuit). Positive signal path 302 can include a first n-channel FET 306 and a second n-channel FET 308 (with FET 308 functioning as a current source), and negative signal path 304 can include a third n-channel FET 310 and a fourth n-channel FET 312 (with FET 312 functioning as a current source). More specifically, the positive input (INP) and output (OUTP) of source-follower circuit 300 are coupled, respectively, to the gate and source terminals of first n-channel FET 306, and the negative input (INN) and output (OUTN) are coupled, respectively, to the gate and source terminals of third n-channel FET 310. For simplicity of illustration, only the common modes of the positive and negative inputs are shown as coupled to the gate terminals of first n-channel FET 306 and third n-channel FET 310. Although not shown in FIG. 3A, the T/H and sub-ADC circuits coupled to differential source-follower circuit 300 also have positive and negative signal paths respectively coupled to positive and negative signal paths 302 and 304.

Adjusting the input common-mode voltage of source-follower circuit 300 means adjusting the DC level of the gate terminals of first n-channel FET 306 and third n-channel FET 310. According to some aspects, differential source-follower circuit 300 can include a digital-to-analog converter (DAC) 314 coupled to the gate terminals of first n-channel FET 306 and third n-channel FET 310 via isolation resistors 342 and 344, respectively. DAC 314 can be referred to as an input-CM-setting DAC because it is responsible for setting the input common-mode voltage of source-follower circuit 300. DAC 314 can output an analog signal based on a digital signal sent from a control logic, which is not shown in FIG. 3A. More specifically, the control logic can generate an appropriate digital signal based on the current PVT such that the analog signal outputted by DAC 314 can optimally set the input common-mode voltage for both positive and negative signal paths 302 and 304 of source-follower circuit 300. As the PVT changes, the digital logic can update the digital signal sent to DAC 314 in order to update the input common-mode setting of differential source-follower circuit 300. In the example shown in FIG. 3A, the input common-mode voltages of both positive and negative signal paths 302 and 304 are adjusted based on the output of a single DAC (i.e., input-CM-setting DAC 314), meaning that they are set to the same value. It is also possible to independently set the input common-mode voltages of positive and negative signal paths 302 and 304 to different values.

Adjusting the output common-mode voltage of source-follower circuit 300 means adjusting the DC level of the source terminals of first n-channel FET 306 and third n-channel FET 310. According to some aspects, such adjustment can be made by adjusting the Bias_n settings of differential source-follower circuit 300 (i.e., by adjusting the bias voltage at the gate terminals of n-channel FETs or current sources 308 and 312). FIG. 3A shows that the output of each signal path is coupled to a resistor, and the two resistors are connected in series. For example, the output of positive signal path 302 (i.e., the source terminal of n-channel FET 306) and the output of negative signal path 304 (i.e., the source terminal of n-channel FET 310) can be coupled to a pair of resistors 316 and 318 that are connected in series. The two resistors can be sufficiently identical such that a voltage level at a connection point 320 can indicate the output common-mode voltage of source-follower circuit 300. According to some aspects, resistors 316 and 318 can both be approximately 10 kΩ.

Connection point 320 can be coupled to one input (e.g., the positive input) of a comparator 322, which can include a high-gain differential amplifier. The other input (e.g., the negative input) of comparator 322 can be coupled to an output-CM-reference DAC 324 that can provide an output-CM-reference signal. More specifically, the output-CM-reference signal can be generated based on a digital signal sent from a control logic, which is not shown in FIG. 3A. The output-CM-reference signal can indicate the desired output common-mode voltage of source-follower circuit 300. Similar to input-CM-setting DAC 314, output-CM-reference DAC 324 can receive updated control signals to update the output-CM-reference signal based on the PVT variations. The voltage level at connection point 320 (i.e., the actual output common-mode voltage of source-follower circuit 300) can be compared with the output-CM-reference signal. In the example shown in FIG. 3A, an analog control loop is implemented in which the output of comparator 322 can be coupled, directly, to the gate terminals of n-channel FETs 308 and 312, which function as current sources. More specifically, the analog control loop can be a negative feedback loop with high gain. If the actual output common-mode voltage is greater than the output-CM-reference signal, the comparator output is high, which can turn on or increase current flowing through n-channel FETs 308 and 312 to reduce the actual output common-mode voltage (i.e., the voltage level at connection point 320). On the other hand, if the actual output common-mode voltage is less than the output-CM-reference signal, the comparator output is low, which can turn off or decrease current flowing through n-channel FETs or current sources 308 and 312 to increase the actual output common-mode voltage. This way, the actual output common-mode voltage can be set the same as the voltage level of the output-CM-reference signal.

Figure 3B:
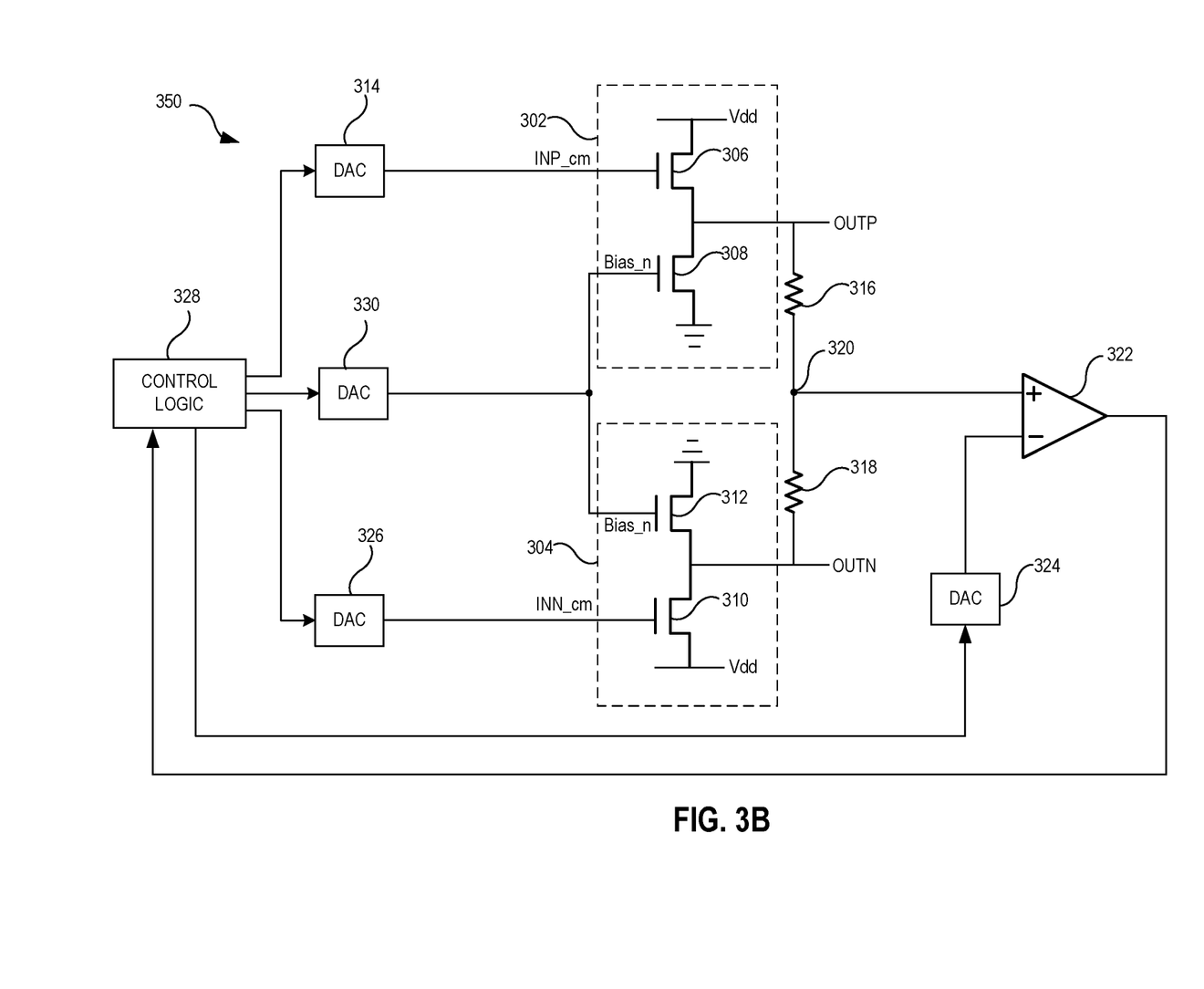
FIG. 3B illustrates an example of a source follower with a common-mode-adjusting circuit, according to one aspect of the instant application.

In the example shown in FIG. 3A, the input common-mode voltages of both input paths of the source follower are set to the same value based on the output of a single DAC and an analog control loop is implemented to dynamically set the output common-mode voltage of the source follower. This scheme requires only two DACs and is easy to implement. It is also possible to set the input common-mode voltages of the two signal paths to different values. FIG. 3B illustrates an example of a source follower with a common-mode-adjusting circuit, according to one aspect. In FIG. 3B, a differential source-follower circuit 350 can be similar to source-follower circuit 300 shown in FIG. 3A and can include a positive signal path 302 (which includes a first n-channel FET 306 and a second n-channel FET 308) and a negative signal path 304 (which includes a third n-channel FET 310 and a fourth n-channel FET 312). In the example shown in FIG. 3B, instead of being coupled to a single DAC 314, gate terminals of n-channel FETs 306 and 308 are separately coupled to two DACs. More specifically, the gate terminal of n-channel FET 306 is coupled to input-CM-setting DAC 314, whereas the gate terminal of n-channel FET 308 is coupled to an additional input-CM-setting DAC 326. During operation, input-CM-setting DAC 314 can dynamically set the input common-mode voltage for positive signal path 302, and additional input-CM-setting DAC 326 can dynamically set the input common-mode voltage for negative signal path 304. These two separate input common-mode voltages can be set independently of each other.

Allowing independent settings of the input common-mode voltages of the positive and negative signal paths can provide the additional benefit of compensating for direct current (DC) offset at the inputs of the source follower. Due to variations in the fabrication process, there might be small and different amounts of DC offset at the two inputs. Because the input common-mode voltages of the positive and negative signal paths can be set to different values, the different amounts of DC offset in the two signal paths can be compensated accordingly. According to some aspects, the DC offset at each input can be measured at the corresponding output (e.g., OUTP or OUTN), and control logic 328 can take into consideration the DC offset when generating and sending the digital signals to DACs 314 and 326 to set the input common-mode voltages. According to some aspects, control logic 328 can be implemented using firmware or hardware, and control logic 328 can generate the digital signals based on the current PVT such that the voltages applied by DACs 314 and 326 to the respective gate terminals of n-channel FETs 306 and 310 can be the optimal common-mode voltages for the T/H circuit under the current PVT.

In addition to compensating for the uneven DC offset at the two inputs, using two DACs to separately set the input common-mode voltages can support low-frequency compensation. More particularly, due to the AC coupling between the receiver frontend and the ADC frontend (e.g., the AC coupling between buffer amplifier 106 and the T/H circuits in even-channel group 102 shown in FIG. 1), baseline wandering may happen where a long string of ones and zeros can cause the signal baseline (e.g., the average signal power) to drift. Baseline wandering can affect low-frequency content of the received signal and cause errors in the detected data. To mitigate this effect (e.g., to compensate for the low-frequency content of the data), DACs 314 and 326 can be configured to apply different voltages to gate terminals of n-channel FETs 306 and 310, respectively. For example, when the incoming data includes a long string of "1"s, DAC 314 can be configured to slightly increase the voltage applied to the gate terminal of n-FET 306; and when the incoming data includes a long string of "0"s, DAC 326 can be configured to slightly decrease the voltage applied to the gate terminal of n-FET 310. According to some aspects, control logic 328 can send control signals to DACs 314 and 326 based on the detected bit values of the incoming data.

Unlike the example shown in FIG. 3A that uses an analog control loop to set the common-mode voltage of the two outputs (i.e., OUTP and OUTN), the example shown in FIG. 3B uses a digital control loop to set the common-mode voltages of the two outputs. The digital control loop can include comparator 322, control logic 328, and an output-CM-setting DAC 330. FIG. 3B shows that the output of comparator 322 is sent to control logic 328, which can in turn generate and send a digital signal to output-CM-setting DAC 330. DAC 330 can convert the received digital signal to an analog signal (e.g., a voltage signal) and send the analog signal to the gate terminals of n-channel FETs 308 and 312. Depending on the level ("high" or "low") of the analog signal, the common-mode voltages of the two outputs (which can be similar to each other) of source-follower circuit 350 can be adjusted up or down, until their average (as indicated by the voltage level of connection point 320) matches the output-CM-reference signal outputted by output-CM-reference DAC 324. According to some aspects, control logic 328 can generate the digital signal periodically (e.g., every few milliseconds). In one example, at each interval, control logic 328 can compute an average of the output of comparator 322 to determine whether the actual common-mode voltage of the two outputs of source-follower circuit 350 is higher or lower than the output-CM-reference signal outputted by output-CM-reference DAC 324. If it is determined that on average the actual common-mode voltage is higher than the output-CM-reference signal, control logic 328 will generate a digital signal that can "pull" down the voltage level (e.g., by increasing the bias voltage at the gate terminals of n-channel FETs 308 and 312) at connection point 320, thus lowering the output common-mode voltages. On the other hand, if it is determined that on average the actual common-mode voltage is lower than the output-CM-reference signal, control logic 328 will generate a digital signal that can "pull" up the voltage level (e.g., by decreasing the bias at the gate terminals of n-channel FETs 308 and 312) at connection point 320, thus increasing the output common-mode voltages. Compared with the scheme shown in FIG. 3A that uses an analog control loop, the implementation of the digital control loop can be more flexible and have a lower risk of instability.

As can be seen from FIGS. 3A-3B, there are two ways to set the input common-mode voltages of the differential source-follower circuit (i.e., the two separate input common-mode voltages can be set by one or two DACs), and there are two ways to set the output common-mode voltages (i.e., by using an analog or digital control loop). In summary, there can be a total of four possible ways to set the input/output common-mode voltages of a differential source follower. Each approach has its own advantages and disadvantages. For example, using a single DAC to set both input common-mode voltages to the same value is easy to implement (because fewer components are needed), and using two DACs to set the positive and negative input common-mode voltages to different values can provide DC offset compensation and support low-frequency compensation. Using an analog control loop to set the output common-mode voltages is faster compared with a digital control loop, whereas using a digital control loop can provide design flexibility and circuit stability. According to some aspects, the ADC circuit can be designed to be run-time configurable. In other words, the circuit can be configured to work in any one of the four modes during run time to set the input/output common-mode voltages of the source follower.

Figure 4:
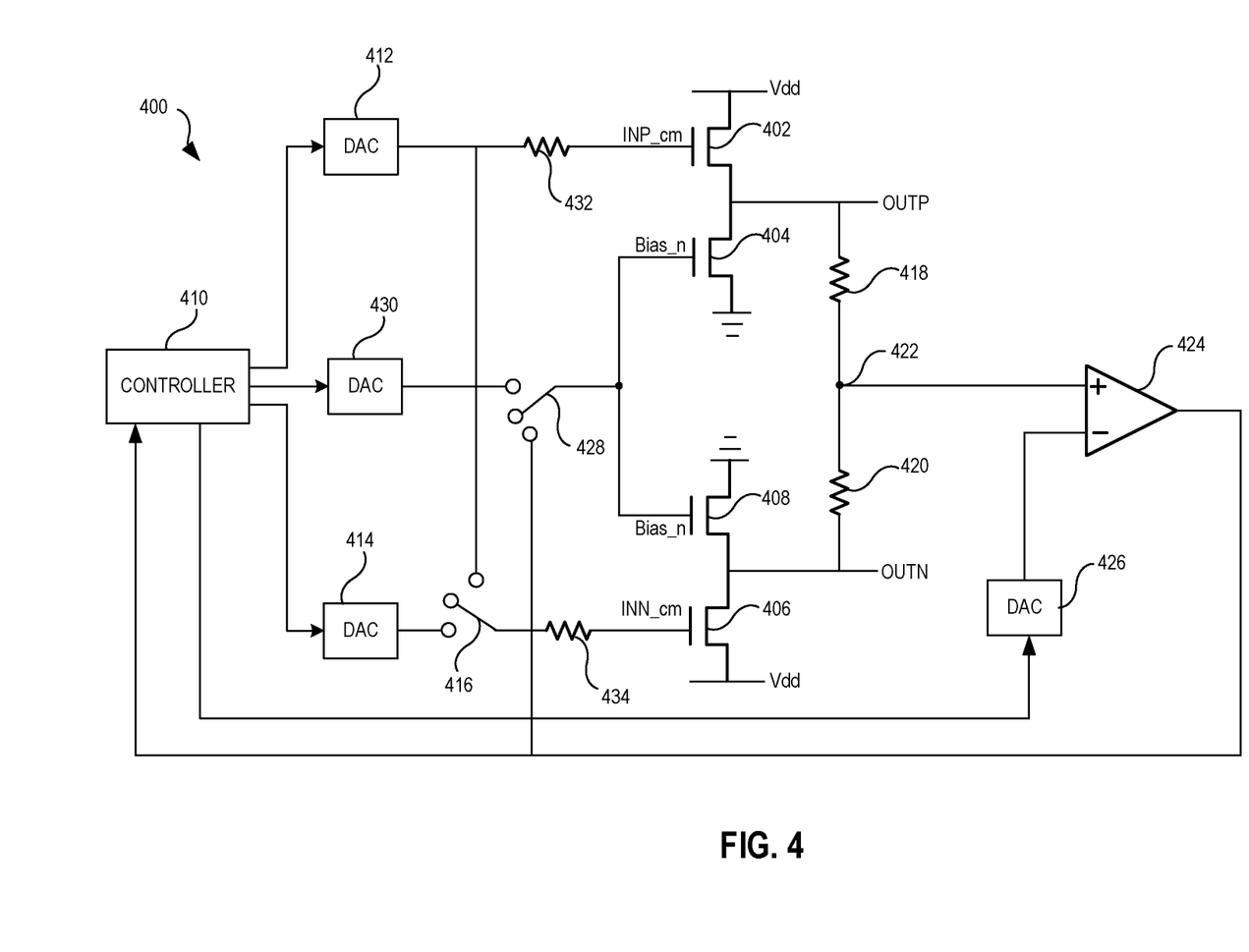
FIG. 4 illustrates a source follower with a configurable common-mode-adjusting circuit, according to one aspect of the instant application.

FIG. 4 illustrates a source follower with a configurable common-mode-adjusting circuit, according to one aspect. In FIG. 4, the positive side of differential source follower 400 can include a first n-channel FET 402 and a second n-channel FET 404, and the negative side of differential source follower 400 can include a third n-channel FET 406 and a fourth n-channel FET 408. The gate terminal of first n-channel FET 402 is coupled to a first input-CM-setting DAC 412 via an isolation resistor 432, and the gate terminal of third n-channel FET 406 is coupled to a switch 416 via an isolation resistor 434, which can be a three-terminal switch with the other two terminals coupled to first input-CM-setting DAC 412 and second input-CM-setting DAC 414. Depending on the state of switch 416, the gate terminal of third n-channel FET 406 can be coupled to first input-CM-setting DAC 412 or second input-CM-setting DAC 414. When switch 416 couples the gate terminal of third n-channel FET 406 to first input-CM-setting DAC 412, the input common-mode voltages of the positive and negative sides of source follower 400 are set by first input-CM-setting DAC 412 to a same value. On the other hand, when switch 416 couples the gate terminal of third n-channel FET 406 to second input-CM-setting DAC 414, the input common-mode voltages of the positive and negative sides of source follower 400 are set, separately, by first input-CM-setting DAC 412 and second input-CM-setting DAC 414 to different values. Both input-CM-setting DACs 412 and 414 can be controlled by a controller 410, which can send digital signals to the input-CM-setting DACs. Note that, if only DAC 412 is activated (i.e., switch 416 couples n-channel FET 406 to DAC 412), controller 410 only needs to send a digital signal to DAC 412. However, if both DACs are activated (i.e., switch 416 couples n-channel FET 406 to DAC 414), controller 410 needs to send digital signals to both DACs. Depending on the application scenario, the digital signals can be the same or different. The digital signals can have an appropriate format depending on the implementation of the DACs (e.g., the number of bits). For example, if a DAC is a 16-bit DAC, controller 410 can send a digital signal comprising data expressed using 16 bits. Upon receiving the data in 16 bits, the DAC can convert the 16 bits of data into an analog signal (e.g., a voltage signal) that can be applied to a corresponding gate terminal. According to some aspects, controller 410 can periodically update the digital signals sent to DACs 412 and 414. According to alternative aspects, controller 410 can update the digital signals when a certain condition is met. For example, when controller 410 detects that a change in the environment (e.g., a change in temperature or $V_{dd}$) exceeds a predetermined threshold, controller 410 can recalibrate the desired input common-mode voltages and send corresponding digital signals to the DAC(s).

The outputs of the positive and negative sides of source follower 400 are coupled to each other via a pair of sufficiently identical resistors 418 and 420 (e.g., the difference in their resistance should be less than 10%), and a connection point 422 between resistors 418 and 420 is coupled to the positive input of a comparator 424. The voltage level at connection point 422 can be the average common-mode voltage of the two outputs. The negative input of comparator 424 is coupled to output-CM-reference DAC 426, which is configured by controller 410. Controller 410 can send a digital signal indicating the desired output common-mode voltage to output-CM-reference DAC 426. Output-CM-reference DAC 426 converts the digital signal (which can include a predetermined number of bits, depending on the implementation of output-CM-reference DAC 426) to an analog signal (e.g., a voltage signal). The output of comparator 424 is coupled to controller 410 and a switch 428, which can be a three-terminal switch with the other two terminals coupled to an output-CM-setting DAC 430 and the gate terminals of n-channel FETs 404 and 408.

When switch 428 couples the output of comparator 424 to the gate terminals of n-channel FETs 404 and 408, an analog control loop (more particularly, a negative feedback loop) is formed, causing the voltage level at connection point 422 (i.e., the actual output common-mode voltage) to be kept approximately the same as the voltage signal outputted by output-CM-reference DAC 426. When the digital signal sent from controller 410 is updated (e.g., periodically or due to the changes in the environment exceeding predetermined values), the actual output common-mode voltage will be updated accordingly.

Switch 428 can also couple the gate terminals of n-channel FETs 404 and 408 to an output-CM-setting DAC 430 to form a digital control loop, in which output-CM-setting DAC 430 receives a digital signal from controller 410, converts the digital signal to an analog signal (e.g., a voltage signal), and applies the voltage signal to the gate terminals of n-channel FETs 404 and 408. The "high" or "low" voltage signal at the gate terminals of n-channel FETs 404 and 408 can lower or increase, respectively, the output common-mode voltages of the two outputs. Controller 410 sends out the digital signal based on the output of comparator 424, such that the digital signal can cause the actual output common-mode voltage to be approximately the same as the voltage signal outputted by output-CM-reference DAC 426.

As can be seen from FIG. 4, the common-mode-adjusting circuit in source follower 400 can include four DACs (DACs 412, 414, 426, and 430), a comparator 424, two three-terminal switches 416 and 428, two resistors 418 and 420, and a controller 410. The common-mode adjusting-circuit can operate in any one of the four modes, depending on the states of three-terminal switches 416 and 428, which can also be controlled by controller 410 or a separate controller not shown in FIG. 4. In the example shown in FIG. 4, a single controller 410 controls all DACs (e.g., by sending digital signals to all DACs). In practice, there can be multiple controller units included in the ADC. For example, there can be one controller unit for controlling first and second input-CM-setting DACs 412 and 414 and output-CM-reference DAC 426, and there can be another controller unit for controlling output-CM-setting DAC 430. Alternatively, each DAC may have its own controller.

As discussed previously, setting the input/output common-mode voltages of the source follower is equivalent to setting the input common-mode voltages of the T/H circuit and the sub-ADC. Therefore, the input common-mode voltage of the source follower should be set to the optimal input common-mode voltage required by the T/H circuit, and the output common-mode voltage of the source follower should be set to the optimal input common-mode voltage required by the sub-ADC. Note that the optimal input common-mode voltage required by the T/H circuit can be higher than that of the sub-ADC, because the T/H circuit requires fast switching. As a result, the common-mode-adjusting circuit adjusts the input/output common-mode voltages of the source follower in a way such that the input common-mode voltage is higher than the output common-mode voltage.

Process variations can affect the requirements for optimal common-mode settings. For example, a particular fabrication process may result in faster n-channel FETs (i.e., with a turn-on time faster than average) but slower p-channel FETs (with a turn-on time slower than average). In such a situation, the optimal input common-mode voltage for the T/H circuit (or the input common-mode voltage for the source follower) should be slightly higher than the typical value (e.g., the typical value being around 0.65 V) due to the relatively high turn-on resistance of the p-channel FET, whereas the optimal input common-mode voltage for the sub-ADC (or the output common-mode voltage for the source follower) should be slightly lower than the typical value (e.g., the typical value being around 0.3 V).

In another example, a different fabrication process may result in faster n-channel and p-channel FETs. In this situation, the optimal input common-mode voltage for the T/H circuit (or the input common-mode voltage for the source follower) should be slightly lower than the typical value (e.g., 0.65 V) due to current leakage, and the optimal input common-mode voltage for the sub-ADC (or the output common-mode voltage for the source follower) should also be slightly lower than the typical value (e.g., 0.3 V). If both the n-channel and p-channel FETs are fabricated as slow devices, the optimal input common-mode voltage for the T/H circuit (or the input common-mode voltage for the source follower) should be slightly higher than the typical value (e.g., 0.65 V), and the optimal input common-mode voltage for the sub-ADC (or the output common-mode voltage for the source follower) should also be slightly higher than the typical value (e.g., 0.3 V). In addition to process variations, different system voltages (e.g., $V_{dd}$) and different temperatures may also require different common-mode settings. In general, a higher $V_{dd}$ can require a higher common-mode setting. A rising temperature may also cause a slightly faster turn-on time, and the optimal common-mode setting should be adjusted accordingly.

Figure 5:
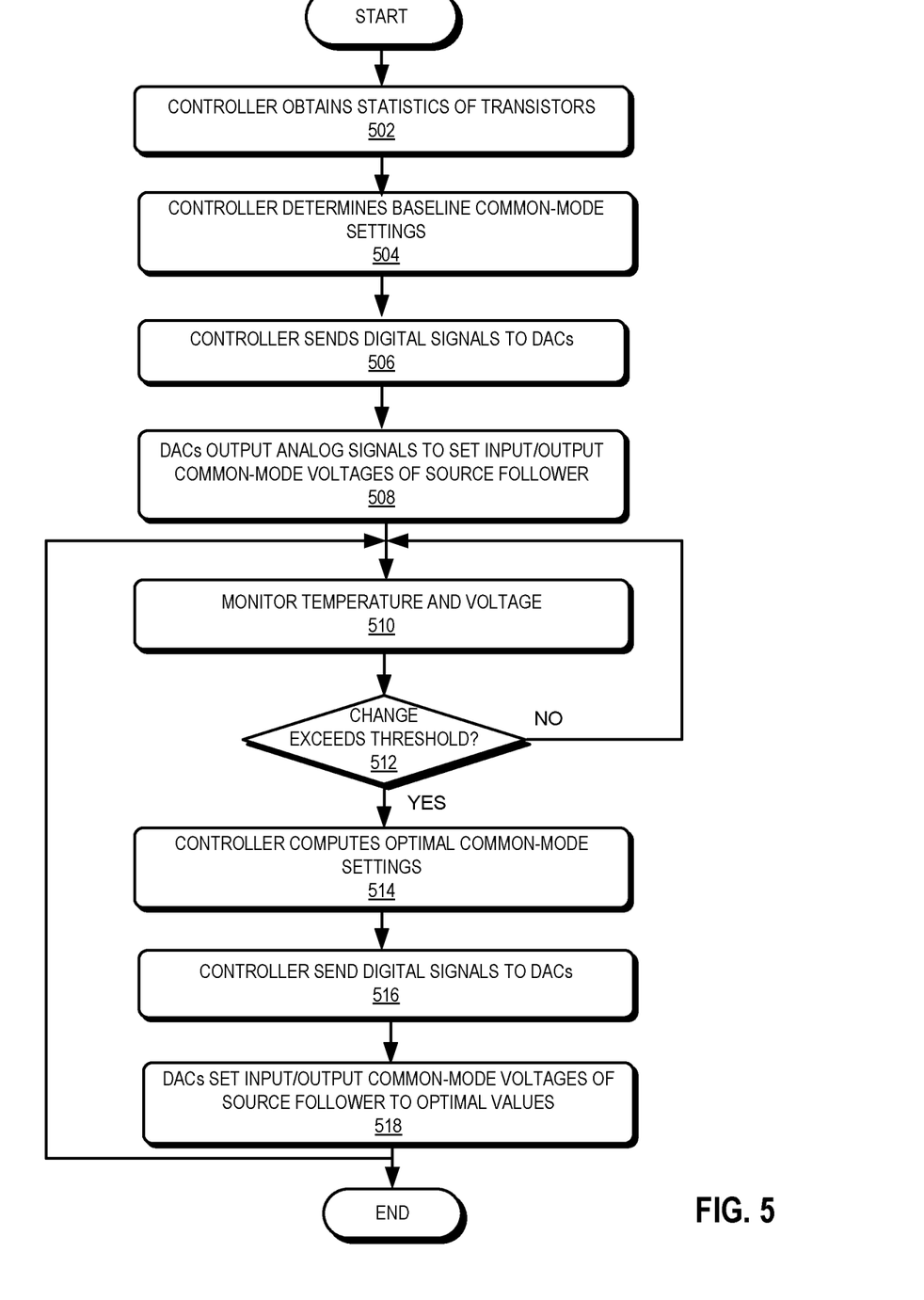
FIG. 5 presents a flowchart illustrating an example of the process of dynamic adjustment of the common-mode settings in an ADC, according to one aspect of the instant application.

Regardless of the mode of operation, the goal of the common-mode-adjusting circuit is to adjust the common-mode settings of the source follower such that the common-mode settings of the T/H circuit and the sub-ADC can be tuned to their optimal values according to the PVT. Due to the dynamic nature of the voltage and temperature, the common-mode settings of the source follower should be adjusted dynamically. According to some aspects, the common-mode settings of the source follower can be adjusted periodically or responsive to changes in voltage and/or temperature. FIG. 5 presents a flowchart illustrating an example of the process of dynamic adjustment of the common-mode settings in an ADC, according to one aspect. Before the ADC is deployed, the statistics of transistors in the ADC can be obtained to determine the characteristics of the transistors (operation 502). Certain processes are known to produce faster transistors, while a different process may produce slower transistors. Baseline common-mode settings for each ADC channel can be determined based on the characteristics of the transistors and default temperature and system voltage levels (operation 504). The baseline common-mode settings can include the input/output common-mode voltages of a source-follower circuit (e.g., circuit 116 in FIG. 1) positioned between the T/H circuit (e.g., T/H circuit 112) and the sub-ADC circuit (e.g., sub-ADC circuit 114). The controller (e.g., controller 410 in FIG. 4) in each ADC channel can send digital signals indicating the baseline common-mode voltages to respective DACs (e.g., DACs 412, 414, and 426) (operation 506).

After the ADC is deployed, the aforementioned DACs output analog signals (e.g., voltage signals) to set the input/output common-mode voltages of the source follower according to the baseline common-mode settings (operation 508). For example, the DACs can output analog signals (e.g., voltage signals) to be applied to gate terminals of corresponding transistors (e.g., n-channels FETs 402 and 406) and to be sent to the input of a comparator (e.g., comparator 424).

While the ADC is in operation, temperature and system voltages can be monitored (e.g., by sensors) (operation 510), and the controller can determine whether the change in the temperature and/or voltage levels exceeds a predetermined threshold (operation 512). The threshold can be an absolute value or a percentage. If the threshold is not exceeded, the system continues to monitor the temperature and system voltages (operation 510). If the threshold is exceeded, the controller can compute the optimal or desired common-mode settings based on the monitored temperature and/or voltage levels (operation 514). For example, if the controller determines that a current temperature or system voltage is 10% higher than a previously recorded value, the controller may compute/update the optimal or desired common-mode settings based on the current temperature or system voltage value. The controller can then generate and send digital control signals to the DACs, indicating the current optimal or desired common-mode voltages (operation 516). The DACs can in turn output analog signals to set the input/output common-mode voltages of the source follower according to the optimal common-mode settings (operation 518). More particularly, the DACs can receive, from the controller, digital control signals specifying the desired common-mode voltages, convert the received digital signals to analog signals, and apply the analog signals to the aforementioned gate terminals and comparator input, thereby causing the input/common mode voltages of the source follower to be updated to the current optimal or desired common-mode voltages. After setting the optimal or desired common-mode voltages, the system can continue to monitor the temperature and system voltages (operation 510).

In addition to updating the DACs based on temperature and system voltages, according to some aspects, when computing for the optimal or desired common-mode settings, the controller can also take into consideration the DC offset and the baseline wandering such that the common-mode settings can also compensate for the DC offset and/or baseline wandering. In the example shown in FIG. 4, the controller computes or updates the optimal or desired common-mode settings responsive to changes in the environment (e.g., temperature, voltage, DC offset, baseline wandering, etc.). It is also possible that the controller computes or updates the optimal or desired common-mode settings periodically, e.g., at predetermined time intervals.

In general, the disclosure provides a solution to the problem of adjusting the common-mode settings of the T/H circuits and the sub-ADCs in a TI-ADC. Each ADC channel includes a T/H circuit, a sub-ADC, and a source-follower circuit positioned between the T/H circuit and the sub-ADC to provide voltage buffering. Adjusting the input common-mode settings of the T/H circuit and the sub-ADC becomes the problem of adjusting the input and output common-mode settings of the source-follower circuit. For a differential source-follower circuit, the input common-mode voltages of the positive and negative sides can be adjusted together (e.g., using a single DAC) or separately (e.g., using a pair of DACs). More particularly, a DAC can convert a digital signal representing an optimal or desired input common-mode voltage to an analog signal and apply the analog signal to an input of the source-follower circuit, thereby setting the corresponding input common-mode voltage of the source-follower circuit to the optimal or desired value. When two DACs are used to allow the two separate input common-mode voltages to be set at different values, DC offset and low-frequency component can also be compensated for. An analog or digital control loop can be used to set the output common-mode voltages of the source-follower circuit. More specifically, an actual output common-mode voltage of the source follower can be compared with the optimal or desired output common-mode voltage, and the comparison result can be used by the feedback control loop to set the actual output common-mode voltage to the optimal or desired value. The common-mode-adjusting circuit can include one or more three-terminal switches to allow the circuit to operate in one of the multiple possible modes for setting the common-mode voltages. Because the optimal common-mode voltages can vary due to the changes in the environment (e.g., changes in temperature and/or system voltage), adjusting the common-mode voltages of the source-follower circuit can also be a dynamic process, in which a controller dynamically updates the digital control signals sent to the DACs based on environment factors (e.g., temperature, voltage, or both).

One aspect can provide a frontend circuit of a time-interleaved analog-to-digital converter (ADC). The frontend circuit can include a track-and-hold circuit to sample an analog input signal to the ADC, a sub-analog-to-digital converter (sub-ADC) circuit to convert the sampled analog input signal to a digital output signal, and a source-follower circuit. An input of the source-follower circuit can be coupled to an output of the track-and-hold circuit, and an output of the source-follower circuit can be coupled to an input of the sub-ADC circuit. The source-follower circuit is to provide buffering between the track-and-hold circuit and the sub-ADC circuit. The circuit further includes a common-mode-adjusting circuit to dynamically adjust common-mode settings of the time-interleaved ADC. While adjusting the common-mode settings, the common-mode-adjusting circuit can adjust, separately, an input common-mode voltage of the track-and-hold circuit and an input common-mode voltage of the sub-ADC circuit based on current Process, Voltage, and Temperature (PVT) conditions.

In a variation on this aspect, the common-mode-adjusting circuit can adjust the input common-mode voltage of the track-and-hold circuit by adjusting an input common-mode voltage of the source-follower circuit.

In a further variation, the common-mode-adjusting circuit can include a first digital-to-analog converter (DAC) coupled to a first input terminal of the source-follower circuit to adjust the input common-mode voltage of the source-follower circuit based on an output of the first DAC.

In a further variation, the common-mode-adjusting circuit can include a second digital-to-analog converter (DAC) coupled to a second input terminal of the source-follower circuit to adjust a second input common-mode voltage of the source-follower circuit based on an output of the second DAC.

In a further variation, the common-mode-adjusting circuit comprises a switch to allow the second input terminal of the source-follower circuit to be coupled to the first DAC or the second DAC.

In a further variation, the first and second DACs can adjust common-mode voltages on the first and second input terminals independently of each other to facilitate compensation for direct-current (DC) offset and/or baseline wandering.

In a further variation, the common-mode-adjusting circuit can include a controller to send a digital signal indicating a desired input common-mode voltage of the source-follower circuit to the first DAC, which converts the digital signal to an analog signal to be applied to the first input terminal.

In a variation on this aspect, the controller can compute the desired input common-mode voltage based on the current PVT conditions.

In a variation on this aspect, the common-mode-adjusting circuit can adjust the input common-mode voltage of the sub-ADC circuit by adjusting an output common-mode voltage of the source-follower circuit.

In a further variation, the common-mode-adjusting circuit can include a control loop comprising a comparator and a third DAC. An output of the source-follower circuit can be coupled to a first input of the comparator, an output of the third DAC can be coupled to a second input of the comparator, and the third DAC can receive, from a controller, a digital signal indicating a desired output common-mode voltage of the source-follower circuit and convert the digital signal to an analog signal to be applied to the second input of the comparator.

In a further variation, the control loop can include a switch to activate an analog control loop or a digital control loop.

In a further variation, the switch can activate the analog control loop by coupling an output of the comparator to a current source of the source-follower circuit, thereby causing the output common-mode voltage of the source-follower circuit to be adjusted based on the output of the third DAC.

In a further variation, the digital control loop can include a fourth DAC coupled to a current source of the source-follower circuit. The switch can activate the digital control loop by coupling an output of the comparator to the controller, which sends a control signal to the fourth DAC, thereby causing the output common-mode voltage of the source-follower circuit to be adjusted based on outputs of the third and fourth DACs.

In a variation on this aspect, the common-mode-adjusting circuit can adjust the input common-mode voltage of the track-and-hold circuit to be higher than the input common-mode voltage of the sub-ADC circuit.

In a variation on this aspect, the frontend circuit can further include a capacitor positioned between the track-and-hold circuit and a frontend circuit of a receiver, such that the frontend circuit of the ADC is AC coupled to the frontend circuit of the receiver.

One aspect can provide a circuit. The circuit can include a source-follower circuit and a common-mode-adjusting circuit coupled to the source-follower circuit to adjust, separately, input and output common-mode voltages of the source-follower circuit. The common-mode-adjusting circuit can include first and second digital-to-analog converters (DACs) and a switch, each DAC to receive, from a controller, a digital signal indicating a desired input common-mode voltage. The switch can couple the first DAC to both first and second input terminals of the source-follower circuit or couple, respectively, the first and second DACs to the first and second input terminals of the source-follower circuit.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A frontend circuit of a time-interleaved analog-to-digital converter (ADC), the frontend circuit comprising:
    a track-and-hold circuit to sample an analog input signal to the ADC;
    a sub-analog-to-digital converter (sub-ADC) circuit to convert the sampled analog input signal to a digital output signal;
    a source-follower circuit, wherein an input of the source-follower circuit is coupled to an output of the track-and-hold circuit and an output of the source-follower circuit is coupled to an input of the sub-ADC circuit, and wherein the source-follower circuit is to provide buffering between the track-and-hold circuit and the sub-ADC circuit; and
    a common-mode-adjusting circuit to dynamically adjust common-mode settings of the time-interleaved ADC, wherein, while adjusting the common-mode settings, the common-mode-adjusting circuit is to adjust, separately, an input common-mode voltage of the track-and-hold circuit and an input common-mode voltage of the sub-ADC circuit based on current Process, Voltage, and Temperature (PVT) conditions.

2. The frontend circuit of claim 1, wherein the common-mode-adjusting circuit is to adjust the input common-mode voltage of the track-and-hold circuit by adjusting an input common-mode voltage of the source-follower circuit.

3. The frontend circuit of claim 2, wherein the common-mode-adjusting circuit comprises a first digital-to-analog converter (DAC) coupled to a first input terminal of the source-follower circuit to adjust the input common-mode voltage of the source-follower circuit based on an output of the first DAC.

4. The frontend circuit of claim 3, wherein the common-mode-adjusting circuit comprises a second digital-to-analog converter (DAC) coupled to a second input terminal of the source-follower circuit to adjust a second input common-mode voltage of the source-follower circuit based on an output of the second DAC.

5. The frontend circuit of claim 4, wherein the common-mode-adjusting circuit comprises a switch to allow the second input terminal of the source-follower circuit to be coupled to the first DAC or the second DAC.

6. The frontend circuit of claim 4, wherein the first and second DACs adjust common-mode voltages on the first and second input terminals independently of each other to facilitate compensation for direct-current (DC) offset and/or baseline wandering.

7. The frontend circuit of claim 3, wherein the common-mode-adjusting circuit comprises a controller to send a digital signal indicating a desired input common-mode voltage of the source-follower circuit to the first DAC, which converts the digital signal to an analog signal to be applied to the first input terminal.

8. The frontend circuit of claim 1, wherein the controller is to compute the desired input common-mode voltage based on the current PVT conditions.

9. The frontend circuit of claim 1, wherein the common-mode-adjusting circuit is to adjust the input common-mode voltage of the sub-ADC circuit by adjusting an output common-mode voltage of the source-follower circuit.

10. The frontend circuit of claim 9, wherein the common-mode-adjusting circuit comprises a control loop comprising a comparator and a third DAC, wherein an output of the source-follower circuit is coupled to a first input of the comparator, wherein an output of the third DAC is coupled to a second input of the comparator, and wherein the third DAC is to receive, from a controller, a digital signal indicating a desired output common-mode voltage of the source-follower circuit and convert the digital signal to an analog signal to be applied to the second input of the comparator.

11. The frontend circuit of claim 10, wherein the control loop comprises a switch to activate an analog control loop or a digital control loop.

12. The frontend circuit of claim 11, wherein the switch activates the analog control loop by coupling an output of the comparator to a current source of the source-follower circuit, thereby causing the output common-mode voltage of the source-follower circuit to be adjusted based on the output of the third DAC.

13. The frontend circuit of claim 11, wherein the digital control loop comprises a fourth DAC coupled to a current source of the source-follower circuit, wherein the switch activates the digital control loop by coupling an output of the comparator to the controller, which sends a control signal to the fourth DAC, thereby causing the output common-mode voltage of the source-follower circuit to be adjusted based on outputs of the third and fourth DACs.

14. The frontend circuit of claim 1, wherein the common-mode-adjusting circuit is to adjust the input common-mode voltage of the track-and-hold circuit to be higher than the input common-mode voltage of the sub-ADC circuit.

15. The frontend circuit of claim 1, further comprising a capacitor positioned between the track-and-hold circuit and a frontend circuit of a receiver, such that the frontend circuit of the ADC is AC coupled to the frontend circuit of the receiver.

16. A circuit, comprising:
a source-follower circuit; and
a common-mode-adjusting circuit coupled to the source-follower circuit to adjust, separately, input and output common-mode voltages of the source-follower circuit;
wherein the common-mode-adjusting circuit comprises first and second digital-to-analog converters (DACs) and a switch, each DAC to receive, from a controller, a digital signal indicating a desired input common-mode voltage;
wherein the switch is to couple the first DAC to both first and second input terminals of the source-follower circuit or couple, respectively, the first and second DACs to the first and second input terminals of the source-follower circuit.

17. The circuit of claim 16, wherein:
when the switch respectively couples the first and second DACs to the first and second input terminals of the source-follower circuit, the first and second DACs are to adjust common-mode voltages on the first and second input terminals independently of each other to facilitate compensation for direct-current (DC) offset and/or baseline wandering.

18. The circuit of claim 16, wherein the common-mode-adjusting circuit comprises a control loop comprising a comparator and a third DAC, wherein an output of the source-follower circuit is coupled to a first input of the comparator, wherein an output of the third DAC is coupled to a second input of the comparator, and wherein the third DAC is to receive, from a controller, a digital signal indicating a desired output common-mode voltage of the source-follower circuit and convert the digital signal to an analog signal to be applied to the second input of the comparator.

19. The circuit of claim 18, wherein the control loop comprises an analog control loop in which an output of the comparator is coupled to a current source of the source-follower circuit, thereby causing the output common-mode voltage of the source-follower circuit to be adjusted based on the output of the third DAC.

20. The frontend circuit of claim 18, wherein the control loop comprises a digital control loop that further comprises a fourth DAC coupled to a current source of the source-follower circuit, wherein the fourth DAC is to receive a digital control signal generated by a controller based on an output of the comparator, thereby causing the output common-mode voltage of the source-follower circuit to be adjusted based on outputs of the third and fourth DACs.

* * * * *